(12) United States Patent
Hill (10) Patent No.: US 6,924,896 B2
(45) Date of Patent: Aug. 2, 2005

(54) INTERFEROMETRY SYSTEM ERROR COMPENSATION IN TWIN STAGE LITHOGRAPHY TOOLS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 300 days.

(21) Appl. No.: 10/411,890

(22) Filed: Apr. 11, 2003

(65) Prior Publication Data

US 2003/0223079 A1 Dec. 4, 2003

Related U.S. Application Data

(60) Provisional application No. 60/371,869, filed on Apr. 11, 2002.

(51) Int. Cl.[7] .................................................. G01B 9/02
(52) U.S. Cl. ..................................................... 356/500
(58) Field of Search .................................. 356/496, 498, 356/500; 250/559.29, 559.3; 355/53

(56) References Cited

U.S. PATENT DOCUMENTS

| | | | |
|---|---|---|---|
| 5,363,196 A | 11/1994 | Cameron | 356/358 |
| 5,764,361 A | 6/1998 | Kato et al. | 356/358 |
| 6,211,965 B1 | 4/2001 | Tsuchiya et al. | 356/493 |
| 6,285,457 B2 | 9/2001 | Ukaji | 356/500 |
| 6,400,441 B1 * | 6/2002 | Nishi et al. | 355/53 |
| 6,665,054 B2 * | 12/2003 | Inoue | 355/77 |
| 6,777,143 B2 * | 8/2004 | Lin | 430/22 |
| 6,785,005 B2 * | 8/2004 | Inoue | 356/500 |

* cited by examiner

Primary Examiner—Gregory J. Toatley, Jr.
Assistant Examiner—Michael A. Lyons
(74) Attorney, Agent, or Firm—Fish & Richardson P.C.

(57) ABSTRACT

Techniques for monitoring the position of a stage in a twin stage lithography tool are disclosed.

43 Claims, 4 Drawing Sheets

FIG. 3 ly accurate

INTERFEROMETRY SYSTEM ERROR COMPENSATION IN TWIN STAGE LITHOGRAPHY TOOLS

CROSS-REFERENCE TO RELATED APPLICATIONS

This application claims priority to Provisional Patent Applications No. 60/371,869 entitled "NON-CYCLIC ERROR COMPENSATION IN TWIN STAGE LITHOGRAPHY TOOLS," to Henry A. Hill, filed on Apr. 11, 2002, the entire contents of which is hereby incorporated by reference.

BACKGROUND

This invention relates to lithography systems and monitoring components in lithography systems using interferometers. More particularly, this invention relates to twin stage lithography systems.

Interferometry systems, including linear and angular displacement measuring and dispersion interferometers, measure linear and angular displacements of a measurement object such as a mask stage or a wafer stage in lithography tools. Such lithography tools are commonly used in fabricating large scale integrated circuits such as computer chips and the like.

The function of a lithography tool is to direct spatially patterned radiation onto a photoresist-coated wafer. The process involves determining which location of the wafer is to receive the radiation (alignment) and applying the radiation to the photoresist at that location (exposure). In lithography, overlay improvement is one of the five most difficult challenges down to and below 100 nm line widths (design rules), see for example the *Semiconductor Industry Roadmap*, p. 82 (1997). Overlay refers to the tools ability to accurately and repeatably position the waver within the tool. Overlay depends directly on the performance, i.e. accuracy and precision, of the distance measuring interferometers used to position the wafer and reticle (or mask) stages. Since a lithography tool may produce $50–$100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography tool, also referred to as an exposure system or exposure tool, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

SUMMARY

During the operation of a lithography tool, a significant amount of time can be spent aligning a wafer prior to exposure, reducing the throughput of the tool. Twin stage lithography tools (also referred to as dual stage lithography tools) allow for some of the alignment procedures for one wafer to be performed concurrent to the exposure of another wafer, thereby increasing wafer throughput.

In twin stage lithography, the wafer stages are exchanged between an exposure position and a load/unload position for alternate exposures. Because some components of the interferometry systems that monitor the wafer's position relative to the exposure apparatus are located on the stage (e.g., the measurement object) while other components are fixed to the frame of the tool (e.g., the interferometer), the relative components of the interferometry system change between alternate exposures. For example, where each stage has a plane mirror measurement object attached, this component alternates relative to an interferometer between exposures.

In systems where error tolerances small, systematic errors in the interferometry system can compromise overlay accuracy and reduce tool yields unless the errors are appropriately compensated or corrected. Systematic errors include those errors referred to as cyclic errors and non-cyclic errors, as well as errors arising from imperfections in the measurement object(s). In twin stage systems, compensating for systematic errors becomes more challenging compared to single stage tools because the components of the system, and thus the systematic errors, change for alternate exposures. Accordingly, in certain aspects, the invention features methods for compensating for systematic interferometry system errors in twin stage lithography systems.

Systematic interferometry system errors in twin stage lithography tools can be compensated by characterizing each component of the system, and characterizing the system for each permutation of its components. For example, the interferometry system is characterized with a first stage in the load/unload position and a second stage in the exposure position, and then with the second stage in the load/unload position and the first stage in the exposure position. Accordingly, when compensating interferometry data for systematic errors, the system tracks the stage configuration and performs the compensation using data appropriate for that configuration.

Prior knowledge of systematic errors, such as non-cyclic errors, can also reduce the time for executing wafer alignment procedures because, using error information, alignment data can be acquired more accurately than where the errors are unknown. Thus, a wafer may be aligned with comparable accuracy to conventional systems using fewer alignment data.

A description of various aspects of the invention follows.

In general, in a first aspect, the invention features a method for using a lithography tool including an exposure apparatus and first and second stages, wherein the first and second stages are transposable between an exposure position proximate to the exposure apparatus and another position remote from the exposure position. The method includes: (i) exposing a first wafer on a first stage to radiation from the exposure apparatus while the first stage is in the exposure position; (ii) interferometrically monitoring the location of the first wafer with respect to a reference position for the first wafer during the exposure, wherein the monitoring includes compensating a measured interference phase based on a first predetermined representation indicative of systematic errors of the interferometry system for the first stage in the exposure position; (iii) exchanging the first stage with the second stage at the exposure position; (iv) exposing a second wafer on the second stage to radiation from the exposure apparatus while the second stage is in the exposure position; and (v) interferometrically monitoring the location of the second wafer with respect to a reference position for the second wafer during the exposure, wherein the monitoring comprises compensating a measured interference phase based on a second predetermined representation indicative of systematic errors of the interferometry system for the second stage in the exposure position.

Embodiments of the method can include one or more of the following features and/or features of the other aspects.

The first predetermined representation can be different from the second predetermined representation. The interferometry system can include an interferometer which during operation directs two beams along different paths and then combines them to produce an output beam, wherein the output beam comprises information about an optical path length difference between the two beams and the systematic errors include errors arising from imperfections in the interferometer that cause a measurable interferometric phase derived from the output beam to deviate from the expression ($\Phi = pknL$, where p is an integer, k is the wavenumber of the output beam, and nL corresponds to the optical path length difference. The deviation can include a non-cyclic error term that varies in a way that is not periodic in the optical path length difference and/or a cyclic error term that varies in a periodic way on the optical path length difference. Alternatively, or additionally, systematic errors can include errors arising from imperfections in a measurement object (e.g variations in the topography of a reflecting surface of the measurement object).

During exposure of the first and second wafers radiation can be directed through a mask thereby forming a radiation pattern on a surface of the wafer. The radiation can be UV radiation. The interferometric monitoring can include monitoring one or more degrees of freedom of the first or second stage in the exposure position. Examples of the one or more degrees of freedom include displacements of the stage along one or more orthogonal axes and/or rotations of the stage about one or more orthogonal axes.

The method can include interferometrically monitoring the location of the first or second stage while the first or second stage is in the other position. Monitoring the first or second stage in the other position can include compensating a measured interference phase related to monitoring the first or second stage in the other position based on the first or second predetermined representation which is also indicative of systematic errors of the interferometry system for the first or second stage in the other position, respectively. The first and second predetermined representations indicative of systematic errors of the interferometry system for the first and second stages in the other position can be different. The method can include loading and/or unloading a wafer from the first or second stage in the other position. In some embodiments, the other position is proximate to an alignment sensor and the method further includes aligning the wafer with respect to the alignment sensor while the first or second stage.

The method can include generating the first and second predetermined representations by characterizing systematic errors in the interferometry system prior to exposing the first and second wafers. The interferometry system can include one or more interferometers and one or more measurement objects and systematic errors in the interferometry system can be characterized by determining systematic errors in the one or more interferometers and one or more measurement objects. Systematic errors in the interferometry system can be characterized for the first and second stages in the exposure position and the first and second stages in the other position.

In general, in another aspect, the invention features a method for using a lithography tool including an exposure apparatus and first and second stages, wherein the first and second stages are transposable between an exposure position proximate to the exposure apparatus and another position remote from the exposure position. The method includes: (i) exposing a first wafer on a first stage to radiation from the exposure apparatus while the first stage is in the exposure position; (ii) interferometrically monitoring the location of the first wafer with respect to a reference position for the first wafer during the exposure, wherein the monitoring includes compensating a measured interference phase based on a first predetermined representation indicative of systematic errors of the interferometry system for the first stage in the exposure position; (iii) exchanging the first stage with the second stage at the second stage at the exposure position; and (iv) exposing a second wafer on the second stage to radiation from the exposure apparatus while the second stage is in the exposure position.

Embodiments of the method can include one or more features of other aspects.

In general, in another aspect, the invention features a twin stage lithography tool, including an exposure system, first and second stages each capable of supporting and positioning a wafer, wherein the first and second stages are transposable between first and second positions, the first position being proximate to the exposure system, an interferometry system including one or more interferometers configured to monitor the location of the first and second stages in the first and second positions, and an electronic storage medium providing a first predetermined representation indicative of systematic errors for the first stage in the first position and a second predetermined representation indicative of systematic errors for the second stage in the first position.

Embodiments of the twin stage lithography tool can include one or more of the following features and/or features of other aspects.

The first predetermined representation can also be indicative of systematic errors for the first stage in the second position and the second predetermined representation is also indicative of systematic errors for the second stage in the second position. The twin stage lithography tool can include an electronic controller configured to couple to the electronic storage medium, wherein during operation the electronic controller corrects the output of the interferometers based on the first and second predetermined representations in the electronic storage medium.

Each of the one or more interferometers during operation can direct two beams along different paths and then combines them to produce an output beam, wherein the output beam includes information about an optical path length difference between the two beams. Imperfections in one of the one or more interferometers can cause a measurable interferometric phase derived from the output beam to deviate from the expression $\Phi=pknL$, where p is an integer, k is the wavenumber of the output beam, and nL corresponds to the optical path length difference. The deviation can include a cyclic error term that varies in a periodic way on the optical path length difference. Alternatively, or additionally, the deviation can include a non-cyclic error term that varies in a way that is not periodic in the optical path length difference.

The first predetermined representation can include information for each of one or more of the interferometers about a deviation of the measured phase from $\Phi=pknL$ as a function of a distance between the interferometer and a measurement object or an orientation of the measurement object with respect to the interferometer for the first stage in the first position. The first predetermined representation can also include information for each of one or more of the interferometers about a deviation of the measured phase from $\Phi=pknL$ as a function of a distance between the interferometer and a measurement object or an orientation of the measurement object with respect to the interferometer for the first stage in the second position. The second predetermined representation can include information for each of one or more of the interferometers about a deviation of the measured phase from $\Phi=pknL$ as a function of a distance between the interferometer and a measurement object or an orientation of the measurement object with respect to the interferometer for the second stage in the first position. The second predetermined representation can also include information for each of one or more of the interferometers about a deviation of the measured phase from $\Phi=pknL$ as a function of a distance between the interferometer and a measurement object or an orientation of the measurement object with respect to the interferometer for the second stage in the second position.

The twin stage lithography tool can include an alignment sensor proximate to the second position, wherein during operation the alignment system locates alignment features on the stage in the second position or on a wafer on the stage in the second position. The interferometry system can include one or more measurement objects mounted on the first stage and one or more measurement objects mounted on the second stage. At least one of the measurement objects mounted on the first stage can be configured to receive a beam from a first of the interferometers when the first stage is in the first position and to receive a beam from a different interferometer when the first stage is in the second position.

In general, in another aspect, the invention features a method including providing an interferometry system comprising an interferometer and first and second measurement objects, alternately monitoring a degree of freedom of the first and second measurement objects with respect to the interferometer, wherein during the monitoring the interferometer directs two beams along different paths and then combines them to produce an output beam, wherein the output beam includes information about an optical path length difference between the two beams and one of the beams contacts the monitored measurement object, and wherein imperfections in the interferometry system cause a measurable interferometric phase derived from the output beam to deviate from the expression $\Phi=pknL$, where p is an integer, k is the wavenumber of the output beam, and nL corresponds to the optical path length difference. The method also includes compensating a measured interference phase based on a first predetermined representation indicative of systematic errors of the interferometry system while monitoring the first measurement object and compensating the measured interference phase based on a second predetermined representation indicative of systematic errors of the interferometry system while monitoring the second measurement object.

Embodiments of the method can include one or more of the following features and/or features of other aspects.

The first and second predetermined representations can be different. The deviation can include a non-cyclic error term that varies in a way that is not periodic in the optical path length difference. Alternatively, or additionally, the deviation can include a cyclic error term that varies in a periodic way on the optical path length difference. Systematic errors can include errors arising from variations in the topography of a reflecting surface of the measurement object.

In a further aspect, the invention features a method for fabricating integrated circuits, the method including a method described with respect to a foregoing aspect.

In another aspect, the invention features a method for fabricating integrated circuits, the method including using the twin stage lithography tool described with respect to a foregoing aspect.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other features, objects, and advantages of the invention will be apparent from the following detailed description.

DESCRIPTION OF DRAWINGS

Like reference symbols in the various drawings indicate like elements.

DETAILED DESCRIPTION

Figure 1A:
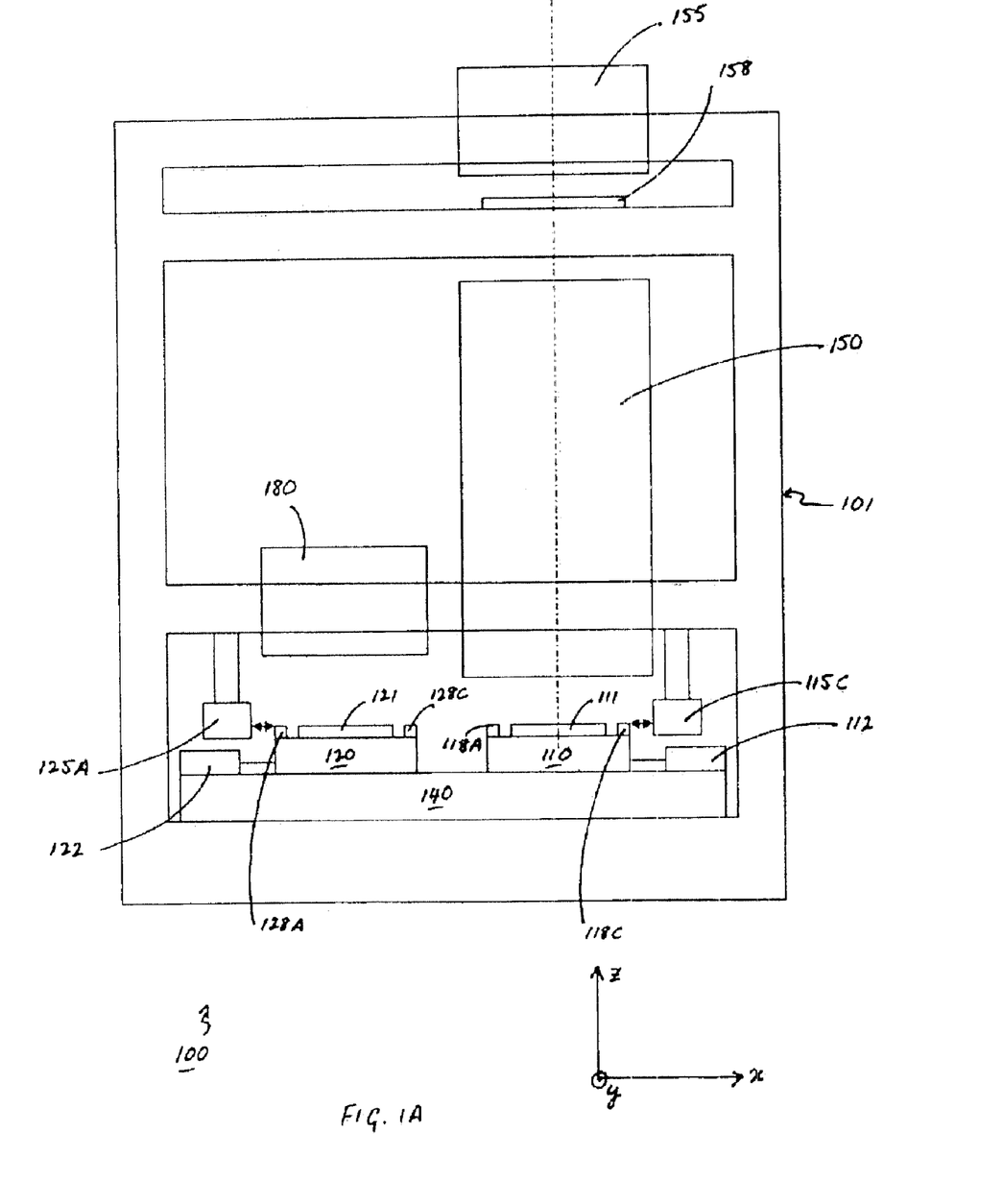
FIG. 1A is a schematic diagram of a twin stage lithography tool.
Figure 1B:
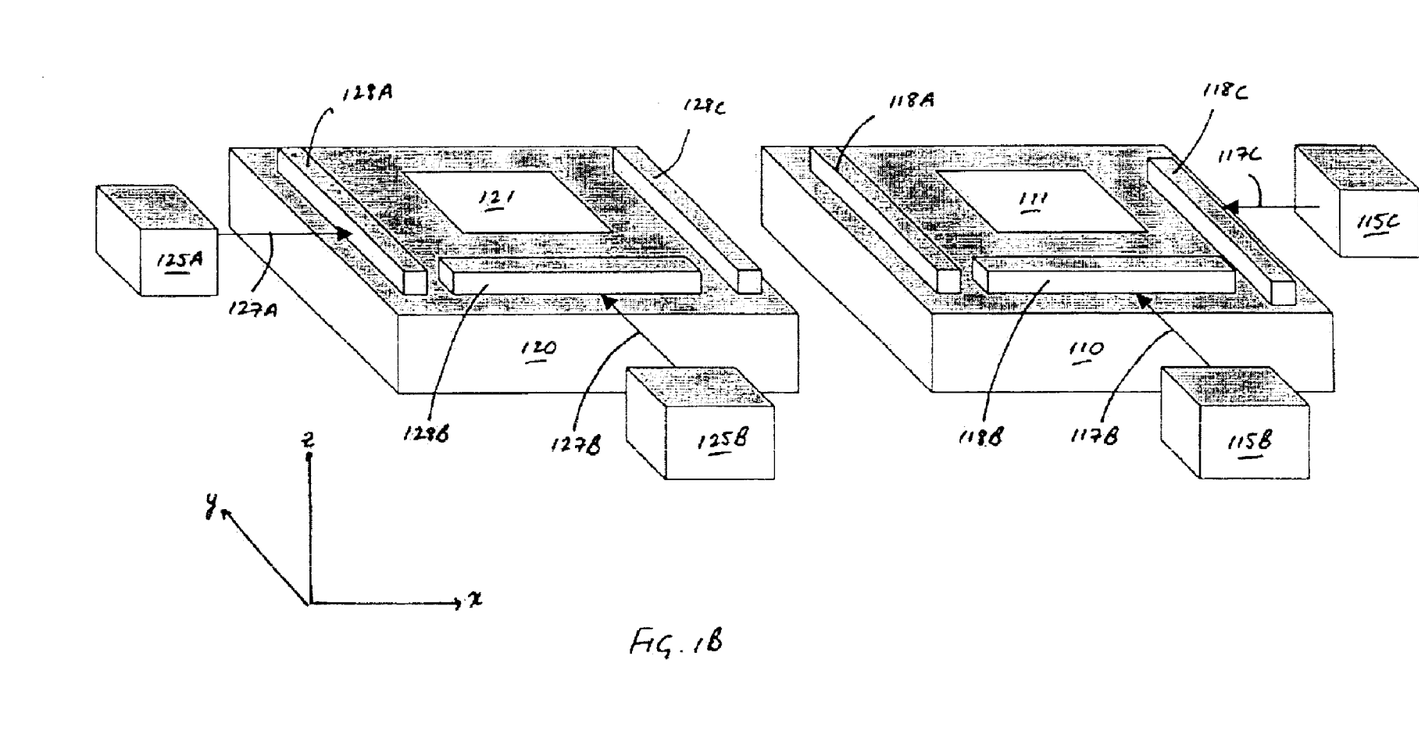
FIG. 1B is a perspective view of components in the twin stage lithography tool shown in FIG. 1A.

Referring to FIG. 1A and FIG. 1B, a twin stage lithography tool 100 includes two wafer stages, stage 110 and stage 120, located on a stage base 140 mounted on a frame 101. Stage 110 and stage 120 position and support wafers 111 and 121, respectively. Stage 110 is located in an exposure position, relative to a lens system 150, which during operation directs radiation from a radiation source 155 to illuminate wafer 111. During exposure of wafer 111, a radiation beam from source 155, e.g., an ultraviolet (UV) beam (e.g., wavelength of 100 nm to 350 nm), passes through beam shaping optics and travels downward toward stage 110 from radiation source 155. The radiation beam passes through a mask 158 carried by a mask stage. The mask is imaged onto wafer 111 on wafer stage 110 via lens system 150.

Stage 120 is positioned in a load/unload position, relative to an alignment sensor 180, which locates the position of wafer 121 on stage 120 by locating alignment marks on the wafer surface. In the load/unload position, a wafer exchanger (not shown) removes exposed wafers from stage 120 and replaces them with an unexposed wafer. The wafer exchanger replaces wafers and alignment sensor 180 locates the new wafers on stage 120 while the tool exposes wafer 111.

A positioning system exchanges the stage 110 and 120 between the exposure position and the load/unload position. The positioning system includes stage actuators 112 and 122. Stage actuators 112 moves stage 110 while actuator 122 moves stage 120. The actuators translate the stages relative to either alignment sensor 180 or lens system 150 when the stage is in the load/unload position or exposure position, respectively. With respect to the co-ordinate system shown in FIGS. 1A and 1B, the actuators translate the stages in the x- and y-directions, and can pivot the stages about the x-, y-, and z-axes.

The positioning system exchanges the stages between the load/unload and exposure positions by rotating base 140 about an axis parallel to the z-axis. In alternative embodiments, base 140 can include conveyors capable of translating the stages along paths in the x- and y-directions. In such embodiments, the positioning system exchanges the stages by first displacing one of the stages in the y-direction, and then moving both stages along parallel paths in opposite directions along the x-axis. Once their positions along the x-axis have been exchanged, the stage originally displaced along the y-axis is returned to its original y-coordinate, completing the exchange.

Base 140 and the various components supported by it are isolated from environmental vibrations by a damping system, including, for example, air bearings.

An interferometry system is used to precisely monitor the position of stages 110 and 120 within tool 100. The interferometry system includes interferometers 115B and 115C, which monitor the position and orientation of stage 110 in the exposure position, and also includes interferometers 125A and 125B monitor the position and orientation of stage 120 in the load/unload position. Interferometers 115B and 125B monitor stage displacements in the y-direction, while interferometers 115C and 125A monitor stage displacements in the x-direction. The interferometers monitor the stage positions/orientations by directing measurement beams to reflect from plane mirror measurement objects mounted on each stage. In the present embodiment, three measurement objects are mounted on each stage: measurement objects 118A, 118B, and 118C are mounted on stage 110; and measurement objects 128A, 128B, and 128C are mounted on stage 120. Measurement objects 118B and 118C reflect measurement beams 117B and 117C to interferometers 115B and 115C, respectively. Similarly, measurement objects 128A and 128B reflect measurement beams 127A and 127B to interferometers 125A and 125B, respectively.

Another positioning system positions mask 158 relative to radiation source 155 and lens system 150. The positioning system can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Alignment sensor 180 can be, for example, a diffraction-based system using a laser, or a broadband, CCD camera-based system. Both of these alignment systems use specialized alignment marks on the wafer. Each sensor offers a choice of alignment marks, that can be designed to optimize the overlay control of different levels (process layers).

While stage 120 is in the load/unload position, alignment sensor 180 locates alignment marks on stage 120 and/or wafer 121 in order to determine the location of wafer 121 on stage 120. When a lithography tool aligns a wafer, it finds the user-definable locations where the alignment targets are located. A typical alignment layout includes six to eight alignment mark sites located at about 70% of the wafer radius in a circular fashion. From this data set, a linear model can be determined specifying the wafer grid and/or shot terms. The linear model quantifies the scaling, rotation and orthogonality of the wafer grid and the exposure shot terms. These model calculations quantify the alignment corrections for scaling, rotation and orthogonality of the tool. The linear model can then be subtracted from the measured alignment data resulting in alignment residuals, or non-linear errors (NLEs). The NLE is used here as a metric of the quality of the level alignment.

Another alignment sensor can be included with lens system 150 to locate the alignment marks when the wafer is in the exposure position.

An electronic controller (e.g., a computer) is in communication with various components of tool 100 (e.g., with radiation source 155, lens system 150, alignment sensor 180, and interferometers 115B, 115C, 125A, and 125B) and co-ordinates the placement, exposure, and removal of wafers in the system. The electronic controller can include a user interface through which an operator can provide information and initiate various tool procedures.

In other embodiments of lithographic tool 100, the interferometry system can be used to measure distance along multiple axes and angles associated for example with, but not limited to, the mask (or reticle) stages. Also, rather than a UV laser beam, other beams can be used to expose the wafer including, e.g., x-ray beams, electron beams, ion beams, and visible optical beams.

In some embodiments, the lithography scanner can include what is known in the art as a column reference. In such embodiments, one or more of the interferometers direct a reference beam along an external reference path that contacts a reference mirror mounted on some structure that directs the radiation beam, e.g., a lens system 150. The reference mirror reflects the reference beam back to the interferometer. The interference signal produce by the interferometer when combining the measurement beam reflected from the measurement object on stage 110 and the reference beam reflected from a reference mirror mounted on the lens housing indicates changes in the position of the stage relative to the radiation beam. Furthermore, in other embodiments the interferometry system can be positioned to measure changes in the position of reticle (or mask) stage or other movable components of lithography tool 100. Finally, the interferometry systems can be used in a similar fashion with lithography systems involving steppers, in addition to, or rather than, scanners.

Before describing the operation of lithography tool 100, the operation of interferometers 115B, 115C, 125A, and 125B and sources of systematic errors arising from the interferometry system are described in detail. These errors are characterized prior to the tool's use, and/or at times when the tool is offline. Although the components of the interferometry system (e.g., the interferometers and the measurement objects) can be characterized prior to their installation in the tool, it may be advantageous to characterize them once they are installed as sources of the systematic errors can develop during their installation or use. For example, stresses due to the fastening of a stage mirror measurement object to the stage can distort the mirror's surface, resulting in systematic errors. Moreover, due to the use of different measurement objects with each interferometer due to the exchange of changes, errors in the interferometry system should be characterized for each permutation of the interferometry system, and compensated accordingly. Additional sources of systematic errors and methods for their characterization are described below.

Displacement measuring interferometers, such as those used in tool 100, monitor changes in the position of a measurement object relative to a reference object based on an optical interference signal. The interferometer generates the optical interference signal by overlapping and interfering a measurement beam reflected from the measurement object with a reference beam reflected from the reference object.

Figure 2:
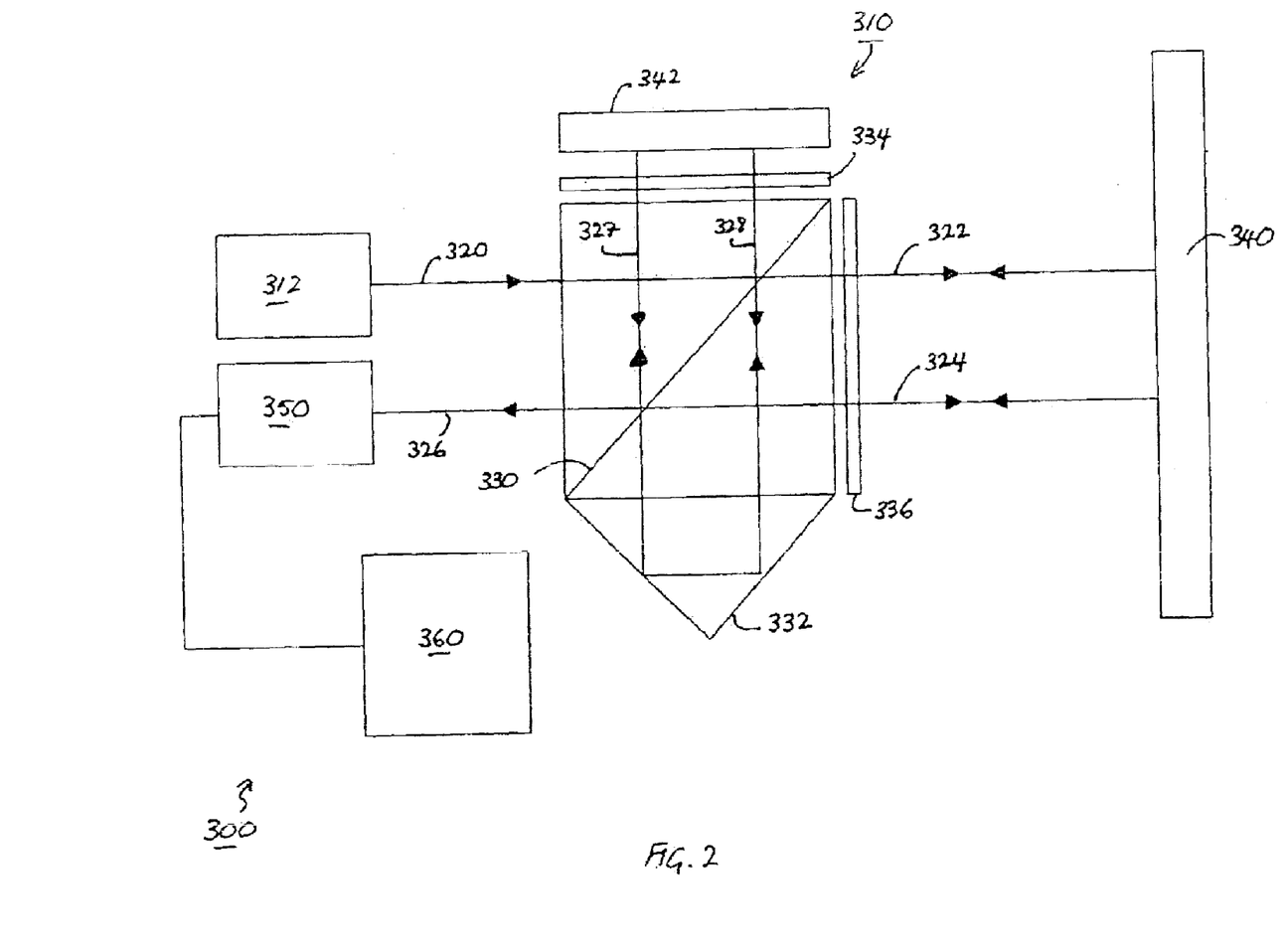
FIG. 2 is a schematic diagram of an interferometry system including a high stability plane mirror interferometer (HSPMI).

Referring to FIG. 2, one example of a displacement measuring interferometer is a high stability plane mirror interferometer (HSPMI) 310, which is shown schematically as part of an interferometry system 300. In addition to HSPMI 310, interferometry system 300 includes plane mirror measurement object 340, source 312, detector 350, and electronic processor and computer 360. HSMPI 310 includes polarization beam-splitter 330, retroreflector 332, quarter wave phase retardation plates 334 and 336, and plane mirror reference mirror 342. Source 312 directs an input beam 320 to HSPMI 310, which splits the input beam into two components. One component, shown as first and second pass measurement beams 322 and 324, reflects from measurement object 340 twice before exiting HSPMI 310. The other component, shown by first and second pass reference beams 328 and 327, reflect from a reference mirror 342 twice before exiting HSPMI 310. The exiting beam components overlap, and are shown as output beam 26.

In many applications the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

Detector 350 includes a polarizer to mix the reference and measurement beam components of output beam 326 with respect to polarization. Detector 350 measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., due to translating the stage that includes the measurement object, the measured beat frequency includes a Doppler shift equal to 2 vnp/λ, where v is the relative speed of the measurement and reference objects, λ is the wavelength of the measurement and reference beams, n is the refractive index of the medium through which the light beams travel, e.g., air or vacuum, and p is the number of passes to the reference and measurement objects, which in the case of HSPMI 310 is two. Changes in the phase of the measured interference signal correspond to changes in the relative position of the measurement object, e.g., a change in phase of 2π corresponds substantially to a distance change L of λ/(2 np). Distance 2L is a round-trip distance change or the change in distance to the measurement object from the interferometer. In other words, the phase Φ, ideally, is directly proportional to L, and can be expressed as $$\Phi = 2\,pkL, \tag{1}$$

where $$k = \frac{2\pi n}{\lambda}.$$

Unfortunately, the observable interference phase, Φ, is not always identically equal to phase Φ. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2 pnL. In particular, a first order cyclic error in phase has for the example a sinusoidal dependence on (4 πpnL)/λ and a second order cyclic error in phase has for the example a sinusoidal dependence on 2 (4 πpnL)/λ. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic non-linearities, which are also termed "non-cyclic errors." One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics,* 20(5), 736–757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as the above-described HSPMI.

Accordingly, due to errors such as the aforementioned cyclic and non-cyclic errors, the observable interference phase typically includes contributions in addition to $\Phi$. Thus, the observable phase is more accurately expressed as $$\tilde{\Phi}=\Phi+\psi+\zeta, \quad (2)$$

where $\psi$ and $\zeta$ are the contributions due to the cyclic and non-cyclic errors, respectively.

In displacement measuring applications, the observable phase is often assumed equal to 2 pkL, which allows one to readily determine L from the measured phase. In many cases, this is a reasonable approximation, particularly where the contribution to due cyclic and/or non-cyclic errors are small, or the level of accuracy required by the application is relatively low. However, in applications demanding a high level of precision, cyclic and/or non-cyclic errors should be accounted for. For example, high precision displacement measurement requirements of integrated circuit microlithography fabrication have become very demanding, in part because of the small field limitations of imaging systems in steppers and scanners and in part because of the continuing reduction in the size of trace widths on wafers. The requirement of high precision displacement measurement with steppers and scanners is typically served with plane mirror interferometers with one of the external mirrors of the plane mirror interferometers attached to a stage mirror of the stepper or scanner.

Because the wafer is typically not flat, the orientation of the wafer stage should also be adjusted in one or more angular degrees of freedom to compensate for the non-flatness of the wafer at exposure sites on a wafer. The combination of the use of plane mirror interferometers and the change in one or more angular degrees of freedom is a source of lateral shear of optical beams across interferometer elements. Effects of beam shears of a reference beam and a measurement beam may be represented effectively as a common mode beam shear and a differential beam shear. The differential beam shear is the difference in lateral shear of reference and measurement and the common mode beam shear is the average lateral shear of the reference and measurement beams.

The aforementioned source of lateral beam shear presents a potentially serious problem in distance measuring interferometry. For a measurement leg length of 1 meter, a typical value for a change in angular orientation of a stage mirror of 0.0005 radians, and a double-pass plane mirror interferometer, the relative lateral shear between the reference and the measurement components of the output beam of the interferometer is 2 millimeters. For a relative lateral shear of 2 millimeters, a beam diameter of 6 millimeters, and wavefront errors in the output beam components of the order of λ/20, an error will be generated in the inferred distance measurement of >/~1 nanometer. This error is a non-cyclic error and can pose a serious limitation to micro-lithographic applications of steppers and scanners in integrated circuit fabrication.

In addition, wavefront errors are produced by imperfections in transmissive surfaces and imperfections in components such as retroreflectors, phase retardation plates, and/or coupling into multi-mode optical fibers that produce undesired deformations of wavefronts of beams.

Different techniques for quantifying cyclic errors are described in commonly owned U.S. Pat. Nos. 6,252,668, 6,246,481, 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic error contribution to the observed phase. In some embodiments, in order to characterize cyclic errors, systems and methods are employed that analyze multiple measurements of an interference signal corresponding to different optical path length differences to quantify the non-linearities. In particular embodiments, the time-varying interference signal or the phase extracted from the time-varying interference signal is Fourier transformed and at least some of the non-linearities are associated with peaks in the square modulus of the Fourier transformed signal (i.e., the power spectrum). The amplitude and phase of the Fourier transform at the frequency of each such peak are used to quantify the associated non-linearity. The frequency of each peak and whether it can be resolved typically depends on the rate of change of the optical path length difference, i.e., on the Doppler shift. Thus, the systems and methods often analyze multiple time-varying interference signals for each of multiple Doppler shifts to thereby resolve non-linearities that may otherwise remain hidden, and also, to interpolate the contributions of the non-linearities to measurements at different Doppler shifts. For example, the contribution of the non-linearities can be interpolated for measurements when the measurement object is stationary or changing direction, i.e., when the Doppler shift is zero or is passing through zero.

One way to reduce non-cyclic errors in an interferometer is to use extremely high quality optical components. Commercially, this solution, is unattractive because of the accompanying increase in cost of the interferometer. Another way to reduce errors is to quantify the errors in the interferometer prior to deploying the interferometer, and then compensate measurements made with the interferometer in its end use application based on the precompiled data.

In some embodiments, quantifying non-cyclic errors associated with an interferometer involves monitoring an observable phase associated with the interferometer output beam while scanning a parameter on which the phase depends. The non-cyclic error contribution to the observable phase is determined from the variation of the observable phase from a reference value, assuming other sources of error are negligible or otherwise compensated. The reference value can be based on another interferometrically generated phase, or can be based on a phase value determined from a mathematical relationship between the observable phase and the parameter being scanned.

Where the reference value is based on another interferometer phase, the reference value can be a redundant phase monitored with a reference interferometer during the scanning. Where the interferometer under test and reference interferometer are configured to monitor the same degree of freedom of the measurement object, the observable phase and redundant phase should be proportional in the absence of non-cyclic errors and other errors. Accordingly, any variation of the observable phase from this relationship can be attributed to the test interferometer non-cyclic errors. Of course, this assumes that the reference interferometer non-cyclic error contribution to the redundant phase measurement is negligible. To ensure this, the reference interferometer can be made using high-quality components to reduce sources of non-cyclic errors in the interferometer. Alternatively, or additionally, the reference interferometer can be operated in a way that reduces non-cyclic errors, e.g., operated a short distance from the measurement object to reduce beam shear, which is a source of non-cyclic errors. Another way to minimize non-cyclic errors in the redundant phase measurement is to use a reference interferometer with known non-cyclic errors. The reference value can then be determined by correcting the observable phase from the reference interferometer with the predetermined non-cyclic error contribution.

Another way to determine a reference value is from a known relationship (e.g., a mathematical formula) relating the scanned parameter to the observable phase. For example, a contribution to the observable phase by the optical path length difference between a measurement beam and a reference beam in an interferometer can be determined from the geometry of the interferometer. This geometric contribution is typically a function of parameters such as the orientation and position of the measurement object with respect to the interferometer. Accordingly, one can monitor the observable phase while scanning one of these parameters, and determine the non-cyclic errors as the variation of the observable phase from the predicted functional dependence of the phase on the scanned parameter.

Non-cyclic error data may be determined for components of interferometers in addition to the whole interferometer assembly. For example, when using a fiber optic pickup (FOP) to transport the interferometer output beam to a remotely positioned detector, artifacts from the interferometer, such as beam shear, can result in additional non-cyclic errors due to coupling the output beam into the FOP. Although these additional non-cyclic errors can be determined for the combined interferometer/FOP assembly, they can also be determined for the FOP alone. The principle for determining the non-cyclic error function for a component is the same as for the interferometer: a system monitors the observable phase generated by an interferometer using the component while scanning a parameter on which the phase depends. The non-cyclic error contribution is determined as the variation of the observable phase from a reference value, assuming that other sources of error are negligible or compensated. In some embodiments, non-cyclic errors in a FOP are measured as functions of differential and common mode beam shear of a two component optical beam, e.g., an output beam of a heterodyne interferometer system.

Important information about the interferometer system in addition to the non-cyclic error function can also be generated in the process of measuring the non-cyclic error function. The additional information may include the measurement axis of the interferometer system as a function of one or more parameters, e.g. the physical length of a measurement path and the directions of propagation of an input beam to the interferometer. For an interferometer assembly including two or more plane mirror interferometers, the process for measuring the non-cyclic error function can also map out the measurement axes for each of the two or more interferometers and may furnish accurate measurement of the separation of the two or more measurement axes. This information may be used to determine changes in angular displacements of the plane mirror measurement object in one or more planes.

Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

Other systematic errors related to the lithography tool interferometry system are also characterized prior to use of the tool. For example, another potential source of systematic errors in the tool's interferometry system mentioned above are imperfections in the reflecting surface of the measurement objects, e.g., variations in the mirror's surface topography. A measure of a mirror's surface topography is the mirror's figure. The figure of each measurement object can be characterized, for example, using a Fizeau interferometer. The figure of the portions of the measurement objects may also be determined by techniques such as described in commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, and U.S. patent application Ser. No. 10/406,749, entitled "Method And Apparatus For Stage Mirror Mapping," filed Apr. 3, 2003, which claims priority to Provisional Patent Application No. 60/371,172 filed on Apr. 9, 2002, with the same title. These applications name Henry Allen Hill as inventor, and the entire contents of each is hereby incorporated by reference.

In some embodiments, the measurement objects are characterized in-situ using the lithography tool interferometers. Each measurement object is characterized using the corresponding interferometer in the exposure position and in the load/unload position. In-situ characterization may be advantageous because what is often important in determining errors associated with a mirror is not necessarily the actual physical deformation of the mirror, but its "effective" optical deformation with respect to the interferometric measurement beam(s) during the lithography exposure cycle. This effect optical deformation includes not only physical deformations in the mirrors, but also optical gradients along the measurement beam path caused by environmental effects, such as heat and air turbulence, produced by the movement of the stage during the photolithography exposure cycle. Such optical gradients can modify the propagation properties of the interferometric measurement beams in the same way as physical deformations in the mirrors. Thus, in some embodiments, the lithography tool implements a mirror characterization procedure in-process to incorporate the environmental effects into the characterization. The characterization is then used to correct in-process interferometric measurements of the stage.

Accordingly, systematic and random errors associated with the measurement objects may be compensated. The corrections account for pre-installation imperfections in the mirrors, deformations in the mirror caused by their installation, and environmental effects during a photolithographic exposure cycle that affect how the mirror surface "appears" to the interferometer used to monitor the stage position. Moreover, the corrections compensate for any in-process degradation of the mirror surfaces due to, e.g., delamination or dirt. Furthermore, the corrections may be averaged and continually updated during multiple cycles of the photolithography exposure cycle to improve their statistically accuracy without compromising the throughput of the lithography tool.

Such mirror characterization techniques can be based on interferometrically measuring the stage position with respect to multiple metrology axes to provide redundant information about the stage position. For example, in-plane rotation of the wafer stage may be measured twice based on separate interferometric measurement beams that contact two different sides of the wafer stage. The two in-plane rotation measurements may then be repeated as the position of the stage is stepped or scanned along a first axis (e.g., the x-axis). Differences between the multiple redundant measures may then be attributed to the effective optical deformation of a first stage mirror oriented parallel to that first axis. The process may then be repeated for multiple translations of the stage along a second axis (e.g., the y-axis) orthogonal to the first axis to determine the effective optical deformation of a second stage mirror oriented parallel to the second axis.

Characterizing an interferometer's systematic errors in these ways can yield one or more phase terms that are a function of the scanned parameters. These phase terms may be stored as, for example, a look-up table, as a power series representation, or as a spectral representation such as in a Fourier series. The phase terms for each interferometer may be the same for the different stages' measurement objects, but are more likely different. Scanned parameters may include the measurement object's position and/or orientation with respect to the interferometer, the position of the interferometer axis with respect to the pivot axis of the measurement object, beam shear, and directions of propagation of measurement and/or reference beams.

The error data may be stored on some electronic data storage medium (e.g., a memory chip or a disk), which is provided to the interferometer's end user. A control algorithm that runs the interferometry system in the tool accesses the non-cyclic error function from the data storage medium, and compensates the observable phase prior to making downstream calculations based on the phase.

Turning now to the operation of lithography tool 100, initially, operation is described briefly for a single wafer, followed by a more detailed description of various process steps. Lithography tool operation is summarized in a flow chart 200, shown in FIG. 3.

Figure 3:
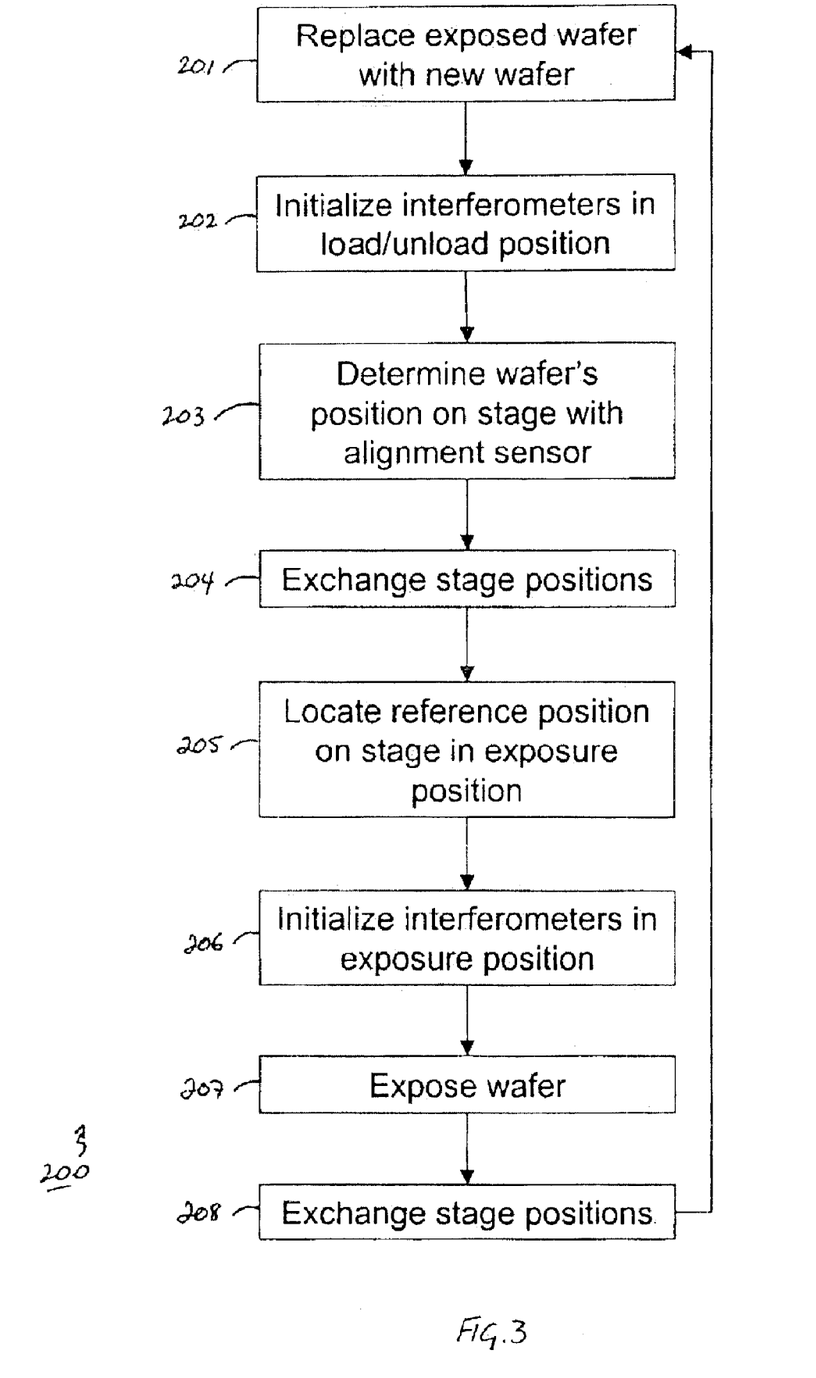
FIG. 3 is a flow chart showing the operation of the twin stage lithography tool.

First, an exposed wafer is removed from stage 120 in the load/unload position, and the wafer exchanger places an unexposed wafer in its place (step 201). Tool 100 then initializes interferometers 125A and 125B (step 202), and then determines the location and orientation of the wafer on stage 120 using alignment sensor 180 and interferometers 125A and 125B (step 203). Tool 100 then exchanges the positions of stage 110 and stage 120, so that stage 120 is in the exposure position and stage 110 is in the load/unload position (step 204). Once stage 120 is in the exposure position, the tool locates a reference position on the stage (step 205) and initializes interferometers 115B and 115C (step 206), and then positions the wafer relative to exposure apparatus 150. Tool 100 then proceeds to expose the wafer (step 207). Once the exposure is complete, tool 100 again exchanges the stages, moving stage 120 back to the load/unload position and stage 110 to the exposure position (step 208), and the procedure repeats.

Returning to the first step, step 201, when placed on stage 120, the location and orientation of the wafer on the stage is not known to sufficient accuracy for the purposes of exposure. Although the wafer can be aligned when in the exposure position, the time taken aligning the wafer in the exposure position can slow down the exposure cycle and reduce wafer throughput. Thus, an alignment step is performed while the wafer is in the load/unload position and the information determined during this alignment is used to reduce alignment time in the exposure position.

The purpose of the alignment step is to determine the position and orientation of the wafer with respect to the stage. Prior to alignment, tool 100 initializes interferometers 125A and 125B in order to register the stage to a reference frame shared by the interferometers. Subsequent movement of the stage within the reference frame is monitored to interferometric accuracy by the interferometers.

Initialization involves moving the stage to a known reference position in the load/unload position. The point at which the stage reaches the reference position can be determined by monitoring optical marks on the stage, or by defining the reference position as the motion limit of the stage in a certain direction or directions. For example, the tool can include one or more stops that limit the motion of the stage in one or more directions. The reference position can correspond to a stage location in which a distance between interferometer 125A and measurement object 128A, and a distance between interferometer 125B and measurement object 128B are relatively small compared to the range of motion of the stage in the load/unload position. For example, in the reference position, these measurement objects can be less than about five centimeters from their respective interferometers.

Once the stage is in the reference position, electronic controller 170 initializes the system by noting a heterodyne interference phase of each signal received from interferometers 125A and 125B. Subsequent changes in these phases are used by the controller to track the location of the measurement objects, and correspondingly, the location of the stage and wafer with respect to the reference position.

After initialization, the location of the stage with respect to a reference frame is known, however, the location of the wafer on the stage is not. To determine the location of the wafer on the stage, the stage actuators scan the stage position until the wafer is located by alignment sensor 180. The location of alignment sensor 180 with respect to the reference frame is known from the system design and calibration. During this scanning, interferometers 125A and 125B monitor the location of the stage. The interferometer measurements are compensated for systematic errors using the data acquired for the system in the current configuration, improving the accuracy of the interferometer measurements. The stage scans the wafer's position until a sufficient number of alignment marks are identified to unequivocally determine the wafer's location and orientation on the stage. Electronic controller retains this information for use in aligning the wafer during exposure.

Once tool 100 has determined the wafer's location, and once the exposure cycle for the wafer on stage 110 is complete, tool 100 exchanges the stage positions, moving stage 120 and wafer 121 to the exposure position. At this stage, although the location and orientation of wafer 121 on stage 120 are known, the location of the stage relative to lens system 150 is not known.

The position of stage 120 with respect to lens system 150 can be determined by moving the stage to a reference position. The reference position can be identified from the mechanical motion limit of the stage and/or by locating one or more alignment marks in the stage or wafer. Once the reference position has been identified, tool 100 initializes interferometers 115B and 115C so that the tool can precisely position the wafer with respect to lens system 150, and can monitor the wafer's position during the exposure scan. Interferometer measurements are compensated for systematic errors using the previously acquired data corresponding to stage 120 in the exposure position. Due to the accuracy improvement provided by error compensation, initial wafer alignment with respect to lens system 150 can be performed to sufficient accuracy by locating fewer alignment marks than may be necessary in comparable systems that don't employ the error compensation.

The exposure proceeds by exposing the wafer to the exposure radiation while scanning the wafer's position so that different portions of the wafer, corresponding to individual microchips or portions of individual microchips, are exposed. During the scanning, the tool monitors the wafers location using interferometers 115B and 115C, again compensating the interferometer measurements for systematic errors. Once the exposure is complete, stage 120 is returned to the load/unload position and wafer 121 is replaced with a new wafer.

Although the foregoing description refers to specific components and configurations of lithography tool 100, the similar concepts can be used in other embodiments. For example, although the foregoing description is with reference to HSPMIs, in general, other types of displacement measuring interferometers can be used. Different types of interferometers include both single and multiple pass interferometers (the HSPMI is a double pass interferometer), and include passive interferometers, dynamic interferometers, and dispersion interferometers. Alternatively, or additionally, lithography tool 100 can include interferometers that monitor more than one degree of freedom, interferometers that monitor variations in angular orientation of a measurement object, and angular displacement interferometers that measure beam propagation direction.

Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application No. 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93–106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Furthermore, while in tool 100 the measurement objects are mounted on the stages and the interferometers are mounted on the frame, other configurations may be employed. For example, the interferometers can be mounted on the stages and the measurement objects on the frame. In some embodiments, the detectors can be located at a location remote from the interferometer, and the output beam can be directed to the detector using a fiber optic pickup (FOP). Some embodiments may include a column reference, which is described above.

In some embodiments, where the mask is regularly changed, a second mask stage can be employed in a similar fashion to the twin wafer stages. Where interferometers are used to monitor the mask positions, similar concepts to those described above may be employed to increase system throughput and/or improve accuracy of mask positioning. More generally, the concepts disclosed herein may be applied to other systems which utilize interferometric monitoring of component positions, wherein the component being monitored changes at different stages during operation.

A number of embodiments of the invention have been described. Nevertheless, it will be understood that various modifications may be made without departing from the spirit and scope of the invention. For example, the disclosed techniques can be applied to other systems (e.g., a single stage tool) where multiple permutations of interferometry system components are used during scanning. One example of this is where when a stage mirror is shortened (e.g., by approximately a factor of two) and is monitored by two, rather than one, interferometers while the stage is in a particular position. As the stage is scanned in the corresponding direction, information is first acquired by one of the interferometers and then by the other. Thus, systematic errors should be determined for both permutations of the stage mirror with the interferometers in order to accurately compensate for them. Accordingly, other embodiments are within the scope of the following claims.

What is claimed is:

1. A method for using a lithography tool including an exposure apparatus and first and second stages, wherein the first and second stages are transposable between an exposure position proximate to the exposure apparatus and another position remote from the exposure position, the method comprising:

exposing a first wafer on a first stage to radiation from the exposure apparatus while the first stage is in the exposure position;

interferometrically monitoring the location of the first wafer with respect to a reference position for the first wafer during the exposure, wherein the monitoring comprises compensating a measured interference phase based on a first predetermined representation indicative of systematic errors of the interferometry system for the first stage in the exposure position;

exchanging the first stage with the second stage at the exposure position;

exposing a second wafer on the second stage to radiation from the exposure apparatus while the second stage is in the exposure position; and interferometrically monitoring the location of the second wafer with respect to a reference position for the second wafer during the exposure, wherein the monitoring comprises compensating a measured interference phase based on a second predetermined representation indicative of systematic errors of the interferometry system for the second stage in the exposure position.

2. The method of claim 1, wherein the first predetermined representation is different from the second predetermined representation.

3. The method of claim 1, wherein the interferometry system comprises an interferometer which during operation directs two beams along different paths and then combines them to produce an output beam, wherein the output beam comprises information about an optical path length difference between the two beams; and wherein the systematic errors comprise errors arising from imperfections in the interferometer that cause a measurable interferometric phase derived from the output beam to deviate from the expression $\Phi=pknL$, where p is an integer, k is the wavenumber of the output beam, and nL corresponds to the optical path length difference.

4. The method of claim 3, wherein the deviation comprises a non-cyclic error term that varies in a way that is not periodic in the optical path length difference.

5. The method of claim 3, wherein the deviation comprises a cyclic error term that varies in a periodic way on the optical path length difference.

6. The method of claim 1, wherein systematic errors comprise errors arising from imperfections in a measurement object.

7. The method of claim 6, wherein imperfections in the measurement object comprise variations in the topography of a reflecting surface of the measurement object.

8. The method of claim 1, wherein during exposure of the first and second wafers radiation is directed through a mask thereby forming a radiation pattern on a surface of the wafer.

9. The method of claim 8, wherein the radiation is UV radiation.

10. The method of claim 1, wherein the interferometric monitoring comprises monitoring one or more degrees of freedom of the first or second stage in the exposure position.

11. The method of claim 10, wherein the one or more degrees of freedom comprise displacements of the stage along one or more orthogonal axes.

12. The method of claim 10, wherein the one or more degrees of freedom comprise rotations of the stage about one or more orthogonal axes.

13. The method of claim 1, further comprising interferometrically monitoring the location of the first or second stage while the first or second stage is in the other position.

14. The method of claim 13, wherein monitoring the first or second stage in the other position comprises compensating a measured interference phase related to monitoring the first or second stage in the other position based on the first or second predetermined representation which is also indicative of systematic errors of the interferometry system for the first or second stage in the other position, respectively.

15. The method of claim 14, wherein the first and second predetermined representations indicative of systematic errors of the interferometry system for the first and second stages in the other position are different.

16. The method of claim 13, further comprising unloading a wafer from the first or second stage in the other position.

17. The method of claim 13, further comprising loading a wafer on the first or second stage in the other position.

18. The method of claim 17, wherein the other position is proximate to an alignment sensor and the method further comprises aligning the wafer with respect to the alignment sensor while the first or second stage.

19. The method of claim 1, further comprising generating the first and second predetermined representations by characterizing systematic errors in the interferometry system prior to exposing the first and second wafers.

20. The method of claim 19, wherein the interferometry system comprises one or more interferometers and one or more measurement objects and systematic errors in the interferometry system are characterized by determining systematic errors in the one or more interferometers and one or more measurement objects.

21. The method of claim 19, wherein systematic errors in the interferometry system are characterized for the first and second stages in the exposure position and the first and second stages in the other position.

22. A method for fabricating integrated circuits, the method comprising the method of claim 1.

23. A method for using a lithography tool including an exposure apparatus and first and second stages, wherein the first and second stages are transposable between an exposure position proximate to the exposure apparatus and another position remote from the exposure position, the method comprising:

exposing a first wafer on a first stage to radiation from the exposure apparatus while the first stage is in the exposure position;

interferometrically monitoring the location of the first wafer with respect to a reference position for the first wafer during the exposure, wherein the monitoring comprises compensating a measured interference phase based on a first predetermined representation indicative of systematic errors of the interferometry system for the first stage in the exposure position;

exchanging the first stage with the second stage at the exposure position; and exposing a second wafer on the second stage to radiation from the exposure apparatus while the second stage is in the exposure position.

24. A twin stage lithography tool, comprising:

an exposure system;

first and second stages each capable of supporting and positioning a wafer, wherein the first and second stages are transposable between first and second positions, the first position being proximate to the exposure system;

an interferometry system comprising one or more interferometers configured to monitor the location of the first and second stages in the first and second positions; and an electronic storage medium providing a first predetermined representation indicative of systematic errors for the first stage in the first position and a second predetermined representation indicative of systematic errors for the second stage in the first position.

25. The twin stage lithography tool of claim 24, wherein the first predetermined representation is also indicative of systematic errors for the first stage in the second position and the second predetermined representation is also indicative of systematic errors for the second stage in the second position.

26. The twin stage lithography tool of claim 24, further comprising an electronic controller configured to couple to the electronic storage medium, wherein during operation the electronic controller corrects the output of the interferometers based on the first and second predetermined representations in the electronic storage medium.

27. The twin stage lithography tool of claim 24, wherein each of the one or more interferometers during operation directs two beams along different paths and then combines them to produce an output beam, wherein the output beam comprises information about an optical path length difference between the two beams.

28. The twin stage lithography tool of claim 27, wherein imperfections in one of the one or more interferometers cause a measurable interferometric phase derived from the output beam to deviate from the expression $\Phi=pknL$, where p is an integer, k is the wavenumber of the output beam, and nL corresponds to the optical path length difference.

29. The twin stage lithography tool of claim 28, wherein the deviation comprises a cyclic error term that varies in a periodic way on the optical path length difference.

30. The twin stage lithography tool of claim 28, wherein the deviation comprises a non-cyclic error term that varies in a way that is not periodic in the optical path length difference.

31. The twin stage lithography tool of claim 28, wherein the first predetermined representation comprises information for each of one or more of the interferometers about a deviation of the measured phase from $\Phi=pknL$ as a function of a distance between the interferometer and a measurement object or an orientation of the measurement object with respect to the interferometer for the first stage in the first position.

32. The twin stage lithography tool of claim 31, wherein the first predetermined representation further comprises information for each of one or more of the interferometers about a deviation of the measured phase from $\Phi=pknL$ as a function of a distance between the interferometer and a measurement object or an orientation of the measurement object with respect to the interferometer for the first stage in the second position.

33. The twin stage lithography tool of claim 28, wherein the second predetermined representation comprises information for each of one or more of the interferometers about a deviation of the measured phase from $\Phi=pknL$ as a function of a distance between the interferometer and a measurement object or an orientation of the measurement object with respect to the interferometer for the second stage in the first position.

34. The twin stage lithography tool of claim 24, wherein the second predetermined representation further comprises information for each of one or more of the interferometers about a deviation of the measured phase from $\Phi=pknL$ as a function of a distance between the interferometer and a measurement object or an orientation of the measurement object with respect to the interferometer for the second stage in the second position.

35. The twin stage lithography tool of claim 24, further comprising an alignment sensor proximate to the second position, wherein during operation the alignment system locates alignment features on the stage in the second position or on a wafer on the stage in the second position.

36. The twin stage lithography tool of claim 24, wherein the interferometry system comprises one or more measurement objects mounted on the first stage and one or more measurement objects mounted on the second stage.

37. The twin stage lithography tool of claim 36, wherein at least one of the measurement objects mounted on the first stage is configured to receive a beam from a first of the interferometers when the first stage is in the first position and to receive a beam from a different interferometer when the first stage is in the second position.

38. A method for fabricating integrated circuits, the method comprising using the twin stage lithography tool of claim 24.

39. A method, comprising:
providing an interferometry system comprising an interferometer and first and second measurement objects;
alternately monitoring a degree of freedom of the first and second measurement objects with respect to the interferometer, wherein during the monitoring the interferometer directs two beams along different paths and then combines them to produce an output beam, wherein the output beam comprises information about an optical path length difference between the two beams and one of the beams contacts the monitored measurement object, and wherein imperfections in the interferometry system cause a measurable interferometric phase derived from the output beam to deviate from the expression $\Phi=pknL$, where p is an integer, k is the wavenumber of the output beam, and nL corresponds to the optical path length difference;
compensating a measured interference phase based on a first predetermined representation indicative of systematic errors of the interferometry system while monitoring the first measurement object;
compensating the measured interference phase based on a second predetermined representation indicative of systematic errors of the interferometry system while monitoring the second measurement object.

40. The method of claim 39, wherein the first and second predetermined representations are different.

41. The method of claim 39, wherein the deviation comprises a non-cyclic error term that varies in a way that is not periodic in the optical path length difference.

42. The method of claim 39, wherein the deviation comprises a cyclic error term that varies in a periodic way on the optical path length difference.

43. The method of claim 39, wherein systematic errors comprise errors arising from variations in the topography of a reflecting surface of the measurement object.

* * * * *